United States Patent [19]

Marshall et al.

[11] Patent Number: 5,142,408
[45] Date of Patent: Aug. 25, 1992

[54] OPTICAL AMPLIFIER

[75] Inventors: Ian W. Marshall, Woodbridge; Michael J. O'Mahony, Felixstowe, both of England

[73] Assignee: British Telecommunications, London, England

[21] Appl. No.: 750,700

[22] Filed: Aug. 20, 1991

Related U.S. Application Data

[63] Continuation of Ser. No. 537,001, Jun. 13, 1990, abandoned, which is a continuation of Ser. No. 282,336, Dec. 5, 1988, abandoned.

[30] Foreign Application Priority Data

Apr. 16, 1987 [GB] United Kingdom ................. 8709224

[51] Int. Cl.$^5$ ............................ H01S 3/09; H01S 3/19
[52] U.S. Cl. .................................... 359/344; 359/345; 372/2.5; 372/44; 372/81
[58] Field of Search ................ 359/344, 345; 372/25, 372/81, 44

[56] References Cited

U.S. PATENT DOCUMENTS

| | | | |
|---|---|---|---|
| 3,571,737 | 3/1971 | Miller | 435/601 |
| 3,668,536 | 6/1972 | Michon | 372/25 |
| 3,786,366 | 1/1974 | Chinenti et al. | 330/4.3 |
| 3,789,317 | 1/1974 | Nishizawa | 330/4.3 |
| 3,887,876 | 4/1975 | Zeidler | 330/4.3 |
| 3,896,398 | 7/1975 | Ueki | 330/4.3 |
| 4,093,924 | 6/1978 | Farcy | 372/30 |
| 4,205,278 | 5/1980 | George et al. | 372/25 |
| 4,484,144 | 11/1984 | Nagagawe et al. | 330/4.3 |
| 4,794,346 | 12/1988 | Miller | 330/4.3 |

FOREIGN PATENT DOCUMENTS 0174729  3/1986  European Pat. Off.
287332  10/1988  European Pat. Off.

OTHER PUBLICATIONS

O'Mahony et al; "Wideband 1.5 mu Optical ..."; Nov. 6, 1986, Electron. Lett., vol. 22, #23, pp. 1238-1240.
Westlake et al; "Gain Characteristics of a 1.5 mu ..."; Jan. 3, 1985, Electron. Lett, vol. 21, #1, pp. 33-35.
Westlake et al; "Assessment of Switiling ..."; May, 8, 1986, Electron. Lett., vol. 22, #10, pp. 541-543.
O'Mahony et al; "Characterization of a Laser ..."; Dec. 13, 1984, IEE Colloq. an AOTS, pp 9/1-6.
Belanger et al.; "Gigawatt Peak-Power Pulse ... (RAAT)"; Canadian S. of Phys., vol. 54, #6, pp. 720-727, Mar. 5, 1976.
Tavis, "A Study of Optical Amplification in a Double Heterostructure GaAs Device Using the Density Matrix Approach", QE-19 IEEE Journal of Quantum Electronics, No. 8, pp. 1302-1311 (Aug. 1983).
M. S. Demokan, "Laser Diode Amplifiers" (Colloquium on heterostructure optoelectronic and high speed devices, paper 6, (Nov. 13, 1984), British Library 3315.470 No. 93 (1984).
Applied Physics Letters, vol. 45, No. 12, Dec. 15, 1984, American Institute of Physics, (New York, US), J. Hegarty et al: "High-speed Modulation and switching with gain in a GaAlAs traveling-wave otpical amplifier'-'—pp. 1314-1316.
O'Mahony et al, "Gain measurements on laser amplifiers for optical transmission systems at 1.5 $\mu$m," Br Telecom Technol Journal, vol. 3, No. 3, p. 25, Jul. 1985.
Steele et al, "100 Mbit/s PSK Heterodyne Experiment Using A Travelling-Wave Laser Amplifier," Electronics Letters, vol. 23, NO. 6, p. 296, Mar. 12, 1987.

(List continued on next page.)

Primary Examiner—Nelson Moskowitz
Attorney, Agent, or Firm—Nixon & Vanderhye

[57] ABSTRACT

A laser amplifier operable such that at the commencement of each output pulse the carrier level has recovered from depletion by the previous pulse. Under these conditions output power commensurate with a much higher carrier density than is usually available is possible. The mode of operation is especially useful as a way of providing high power pulses, for example for use in optical time domain reflectometry. Using a travelling wave amplifier in conjunction with return to zero format data pulses is also disclosed.

30 Claims, 2 Drawing Sheets

OTHER PUBLICATIONS

Adams et al, "Optical Bistability in 1.55 μm Semiconductor Laser Amplifiers," British Telecom Research Laboratories, Martlesham Heath, Ipswich IP5 7RE, UK, p. 173, 1986.

O'Mahony, "Optical amplifiers and their applications," *Phil. Trans. R. Soc. Lond.*, A 329 p. 143 Great Britian, 1989.

Adams, "A Comparison of Active and Passive Optical Bistability in Semiconductors," *IEEE Journal of Quantum Electronics*, vol. QE-21, No. 9, p. 1498, Sep. 1985.

O'Mahony et al, "Wideband Optical Receivers Using Travelling Wave Amplifiers for Gbit/s Systems," British Telecom, *Globecom '87*, p. 833, 1987.

O'Mahony et al, "Low-Reflectivity Semiconductor Laser Amplifier with 20 dB Fibre-To-Fibre Gain at 1500 nm,", *Electronic Letters*, vol. 21, No. 11, p. 501, May 23, 1985.

Marshall et al, "Optical System with Two Packaged 1.5 μm Semiconductor Laser Amplifier Repeaters," *Electronics Letters*, vol. 22, No. 5, p. 253, 27 Feb. 1986.

Westlake, "Measurement of Optical Bistability in An InGaAsP Laser Amplifier at 1.5 μm," *Electronics Letters*, vol. 21, No. 21, Oct. 10, 1985.

Lowery et al, "Stabilization of Mode-Locked Pulses Using Travelling-Wave Semiconductor Laser Amplifier," *Electronics Letters*, vol. 26, No. 2, p. 104, 18 Jan. 1990.

Kawaguchi, "Absorptive and dispersive bistability in semiconductor injection lasers," Invited Paper, *Optical and Quantum Electronics*, 19, p. S1, 1987.

O'Mahony et al, "Semiconductor Laser Amplifiers for Optical Communication Systems," *Br Telecom Technol Journal*, vol. 5, No. 3, p. 9, Jul. 1987.

Marshall, "Gain characteristics of a 1.5 μm nonlinear split contact laser amplifier," *Appl. Phys. Lett.*, vol. 53, No. 17, p. 1577, Oct. 24, 1988.

Marshall et al, "TWSLA Preamplifier Optical receivers," British Telecom Research Labs., Martlesham Heath, Ipswich, UK, p. 483, 1989.

O'Mahony "Semiconductor Laser Amplifiers as repeaters," British Telecom Research Labs., Martlesham Heath, Ipswich, UK, *IOOC-ECOC '85*, p. 39, 1985.

O'Mahony, #TUA5, "Effects of phase noise in injection-locked laser amplifier systems," Paper, British Telecom Research Labs, Martlesham Heath, Ipswich, UK, p. 36, 1986.

Westlake et al, "Optical Bistability in Semiconductor Laser Amplifiers:—Assessment of Switching Speed," Extended Abstracts of the 18th Conference on Solid State Devices and Materials, Tokyo, Japan, p. 161, 1986.

O'Mahony, "Semiconductor Laser Optical Amplifiers for Use in Future Fiber Systems," Invited Paper, *Journal of Lightwave Technology*, vol. 6, No. 4, p. 533, Apr. 1988.

Westlake et al, "BiDirectional and Two-Channel Transmission System Measurements Using A Semiconductor-Laser-Amplifier Repeater," *Electronics Letters*, vol. 23, No. 12, p. 649, Jun. 4, 1987.

Marshall et al, "10 GHz Optical Receiver Using A Travelling-Wave Semiconductor Laser Preamplifier,"*Electronics Letters*, vol. 23, No. 20, p. 1052, Sep. 24, 1987.

Marshall et al, "Picosecond Pulse Response of A Travelling-Wave Semiconductor Laser Amplifier," *Electronics Letters*, vol. 23, No. 16, p. 818, Jul. 30, 1987.

OPTICAL AMPLIFIER

This is a continuation of application Ser. No. 07/537,001 filed Jun. 13, 1990, now abandoned, which is a continuation of Ser. No. 07/282,336 filed Dec. 5, 1988, now abandoned.

This invention relates to optical amplifiers.

Laser amplifiers are of great interest as components in optical communication systems. Unfortunately, the devices suffer from output power saturation at relatively low power, that is in the range of 1 to 10 mW mean power.

There are also various applications for which it is desirable to have high power optical pulses, but at present the equipment necessary to provide such pulses is both expensive and bulky.

The present invention is directed towards obtaining relatively high power optical pulses from laser amplifiers, and in preferred embodiments towards providing portable high power optical sources.

Accordingly the present invention provides an optical amplifier operated such that at the commencement of each output pulse the carrier density in the amplifier has substantially recovered from depletion by the preceding output pulse enabling the output power to be increased to a level commensurate with the carrier density.

In another aspect the invention provides an optical amplifier arranged to provide a pulsed output with the interval between pulses being at least half the time required for substantial recovery of the carrier density from depletion by the preceding output pulse and enabling the output power to be increased to a level determined by the recovered carrier density. Preferably the amplifier is a travelling wave amplifier. The term 'optical' as used herein includes those portions of the electromagnetic spectrum termed 'infra red', visible and 'ultra violet'.

The invention is now described by way of example with reference to the accompanying drawings in which:

FIGS. 1a, 1b, and 1c, shows carrier density versus time in a semiconductor laser amplifier;

Semiconductor laser amplifiers have heretofore been regarded as limited in output power to the order of 1 to 10 mW, and this limitation has been accepted in known applications of the device. However, the present invention is based upon a consideration of the instantaneous carrier concentration available and operation of the device so as to increase or maximise the carrier concentration at the moment of power output demand.

In a semiconductor laser the optical power output is limited by the internal carrier density as it is these carriers that produce the output power by electron-hole recombination in response to the input light signal. The carrier density is a function of the applied bias current, but there is a limit to the current that can be applied because for wideband operation the laser amplifier needs to be operated short of the lasing threshold, typically the bias being 70% of the lasing bias threshold. In the absence of an input light signal the carrier density is static at a level determined by the bias, but as soon as a signal is input that stimulates recombination there is a resultant drop in the carrier concentration. The bias current regenerates carriers but the effect is not instantaneous so that under conditions of sustained input signal (which may be continuous or rapidly repeating pulses such as a run of binary ones) the carrier level remains depleted below the starting level, and steady state operation can only be sustained at a power level based on the carrier concentration in the depleted state. When input signal light is removed the carrier concentration builds up to the original starting level. The time taken for the original starting level to be regained is in general equal to the mean carrier recombination time or carrier lifetime (although optical pumping or bias modulation may vary the parameters). The expression 'recovery time' is used herein to define the time taken for the carrier concentration to be restored to the undepleted level determined by the prevailing bias voltage when there is no input signal i.e. the carrier lifetime. Typically the recovery time (carrier lifetime) may be of the order of 2 ns.

Figure 1A:
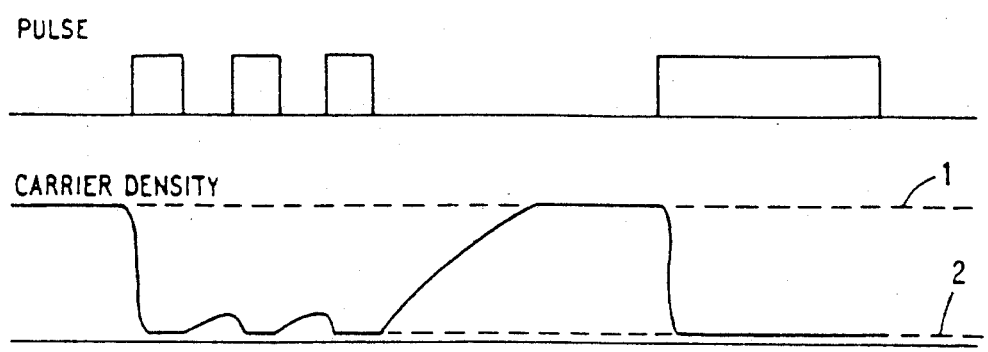

FIG. 1 shows schematically carrier density versus time in a semiconductor laser amplifier for various excitation conditions. In FIG. 1a there is first zero input signal, followed by a series of pulses, then an absence of signal followed by a single long pulse. This sequence could easily correspond to a data signal of binary zeros and ones with the absence of signal representing one or more zeros and the single long pulse being a run of consecutive ones. Under these conditions it can be seen that the carrier density rarely returns to the undepleted level 1; in general the carrier concentration is at a much lower level 2 and it is this lower level that determines the output power. It is not possible to utilise the occasional availability of higher carrier densities because these appear unpredictably (for example only after a sequence of zeros) and cannot be sustained. These are the conditions under which laser amplifiers have been used and illustrates how the accepted limitation arises.

Figure 1B:
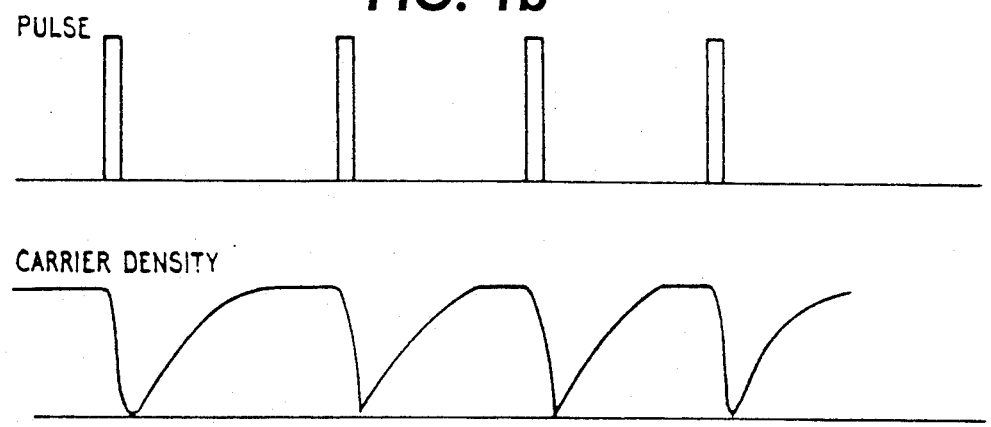

In contrast, in FIG. 1b narrow pulses spaced apart by a distance sufficient to enable substantial recovery of the original carrier density means that the power available for each pulse is based upon the higher carrier density. This is the principle mode of operation according to the invention.

Figure 1C:
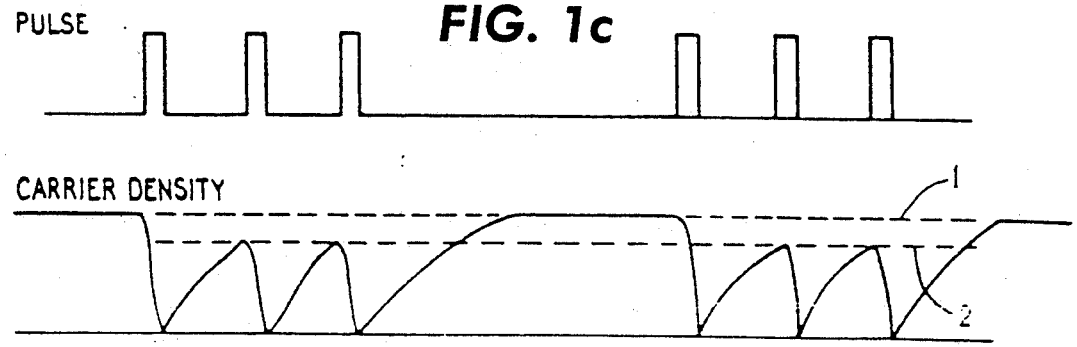

As an intermediate step between conventional operation and that shown in FIG. 1b, incomplete carrier density recovery, but still greater than that permitted by conventional operation, may be provided as shown in FIG. 1c. In this instance intermediate pulse powers are achieved. Use of return to zero data pulses and a narrow pulse width enable much higher powers to be achieved than previously, as seen by comparing FIGS. 1a and 1c.

In order to achieve high power output from a laser amplifier, that is achieving output power commensurate with a carrier density substantially greater than that which leads to output power saturation under conventional operation, requires observation of the following criteria:

1. The input pulse should have a pulse width less than the carrier lifetime recovery time of the amplifier, preferably substantially less.

2. The interval between pulses should permit substantial recovery to take place, preferably the interval should be greater than the recovery time.

Figure 2:
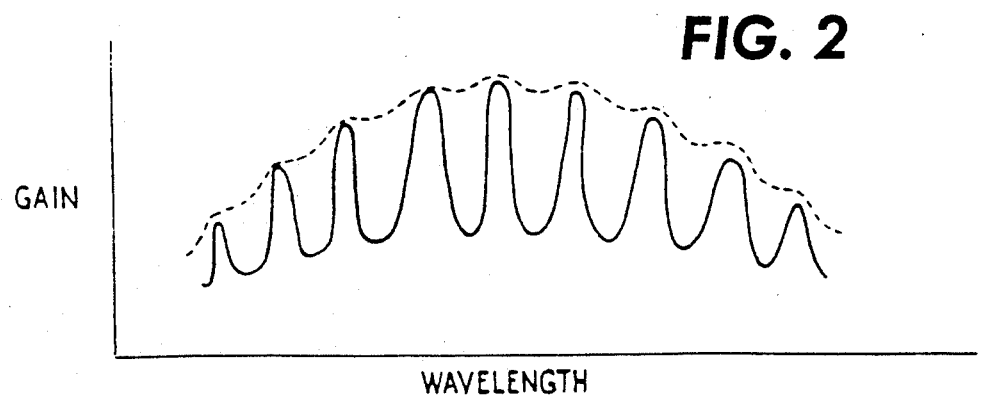
FIG. 2 shows a gain characteristic for a travelling wave amplifier.

3. If a data pattern is to be amplified the input should be in return to zero format to avoid runs of ones resulting in sustained depletion of carrier density. It should be noted that when operating in its conventional mode the carrier density in a laser amplifier remains substantially constant from operational considerations, that is the output is taken with the carrier density depleted to the lower level. However, the mode of operation according to the invention takes the output during a period of considerable change in carrier density, essentially during the drop from the maximum to minimum carrier densities, and this change in carrier concentration causes, in presently available materials, a change in the refractive index of the device medium, which results in wavelength shifts in the amplifier spectrum. FIG. 2 shows (in full lines) the characteristics of amplifier gain versus wavelength for a Fabry Perot laser amplifier from which it can be seen that wavelength shift can have a dramatic effect on amplifier gain. The dotted line in FIG. 2 shows the characteristic for a travelling wave or near travelling laser amplifier in which the gain fluctuation with wavelength is much reduced. For most practical purposes a gain ripple amplitude of about 3 dB at the mean operating wavelength is tolerable (although in some instances 6 dB or more may be acceptable), and so a fourth criterion of operation with carrier density sensitive material in the high power amplification mode of the invention is the use of a travelling wave or near travelling wave amplifier, for example by provision of antireflection coatings on one or more of the laser facets. In this specification 'travelling wave amplifier' is used to denote amplifiers of the type in which this gain ripple is eliminated or suppressed and includes amplifiers of the type termed 'near travelling wave amplifiers'.

Within these constraints the pulse output can be made of higher peak power and shorter duration or of longer duration with lower power. If $P_p$ is the peak output power, $P_s$ the mean output saturation power, $T_r$ the repetition time and T the pulse width it has been found that the following approximate relationship holds approximately for non extreme values.

$$P_p = (T_r/T)P_s$$

Figure 3:
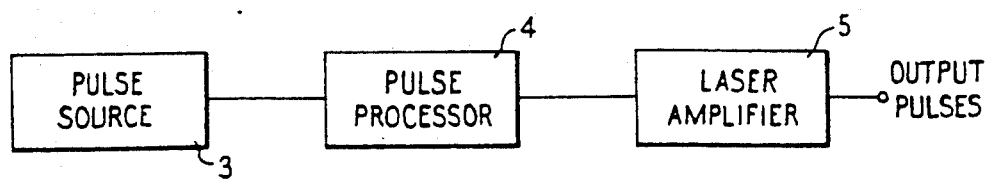
FIG. 3 is a schematic diagram of an embodiment of the invention.

A practical embodiment utilising the above described mode of operation of a laser amplifier is shown schematically in FIG. 3. A primary optical pulse source 3 has its output input to a pulse processor 4 and the pulse processor output is input to the laser amplifier 5. The pulse 3 source and pulse processor may be any components that provide pulses of suitable length and repetition frequency. For example the pulse source may be another laser that is mode locked, from which a stream of pulses of relatively high repetition rate is obtained with the pulse processor blocking most of the pulses so that only every n th pulse is selected and reaches the laser amplifier. Alternatively a source such as a constricted mesa laser may be electrically pulsed to provide pulses of suitable repetition rate, but these are too long in pulse length and so the pulse processor is then a pulse compressor. Another method of providing a suitable pulse source is to gain switch a laser source; the output of this process will usually require both pulse blocking or selection and pulse compression processing. Other possible sources are gas lasers with optical switches, solid state lasers such as iodine lasers and fibre lasers which may be mode locked or Q switched.

Figure 4:
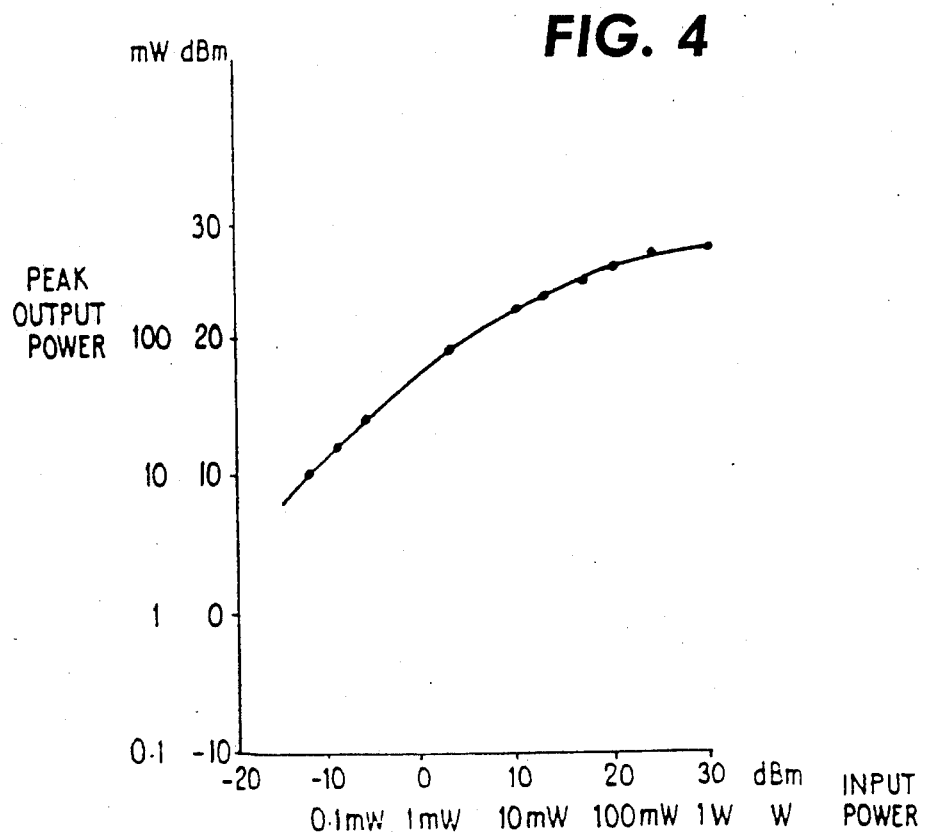
FIG. 4 shows input versus output power for a laser amplifier operated in accordance with the invention.

A suitable laser amplifier 5, for example is a 1.5 microns DCPBH laser of 500 microns cavity length with antireflection coatings on both facets. The coatings may be single layer refractory oxide coatings to provide low facet reflectivities, for example of the order of 0.08% or less. With a pulse source and processor providing a pulse repetition $T_r$ of 10 ns a device with a peak saturation power $P_s$ of 1 mW achieved a peak pulse power of 250 mW for a pulse width of 40 ps; a device with a peak saturation power of 10 mW yielded, for the same pulse period, 2.5 W. As the pulse repetition time $T_r$ increases, the peak power increases until limited by other factors such as laser facet damage. Increasing the pulse width causes decay of the trailing part of the pulse when power cannot be sustained for the full pulse, this effect becoming evident at pulse widths of the order of 1–2 ns. FIG. 4 shows peak input power versus peak output power for the 1.5 microns DCPBH laser biased at 70% of the lasing threshold. In general it is preferred to operate travelling wave laser amplifiers at about 70% of the lasing threshold; at higher biases the ripples in the amplification tend to increase (e.g. 6 dB at 95% of lasing bias compared to 3 dB at 70%) and the bandwidth of the amplifier decreases.

For data applications in which a return to zero format is used for the data a non-standard format is preferably adopted in which the pulse representing binary one occupies only a small proportion of the bit period. For recovery times (carrier lifetimes) of 1 ns data rates of 1 Gbit/sec are possible, the pulse format providing greater receiver sensitivity and hence system performance.

It will be realised that when using a portable primary pulse source such as a semiconductor laser, the laser amplifier operated according to the invention provides a portable and comparatively inexpensive high power pulse source. A particularly important use of such a source is in optical time domain reflectometry (OTDR) in which a pulse of light is launched into a fibre that is to be surveyed for faults and any light returning due to reflection at faults is analysed in order to locate the fault. In this technique the length of fibre that can be surveyed is determined by the sensitivity of the detector and the energy of the pulse that is launched. For high resolution measurements, that is to survey accurately to within centimeters, pulse widths of the order of 100 ps (more generally the range may be 10 to 200 ps) are required. The present invention provides a possible increase of 20 dB in input energy thus enabling either use of less sensitive detectors or survey of a greater length of fibre. For use in the field the portability of the equipment is of significant value.

There are various other uses for a high power optical pulse source, especially in non-destructive testing techniques such as medical diagnostics. One technique currently under development is the monitoring of the concentration of oxygen in the brains of premature babies by high power pulses at infra-red wavelengths. At 1.3 or 1.5 microns the absorbtion of light by tissue (principally water) is low but absorbtion by other materials (like oxygen molecules) is high, so tests can be made through entire organs rather than needing to take a section. However in order to have enough power to provide measurements without causing burning, the source must be pulsed at high speed. Currently the available sources (dye lasers) are not portable however a source based on this invention is easily portable, enabling bedside installation and operation and is capable of providing comparable power.

A particularly preferred pulse format is for the pulse to occupy at most one tenth of the pulse interval and for the pulse interval to be of the order of at least two or three times the recovery time (carrier lifetime).

We claim:

1. A method of driving a semiconductor optical laser amplifier comprising the following steps:
   (a) applying a bias current to said laser amplifier at a level less than that required to induce lasing in said amplifier, said bias current establishing an internal carrier density within said amplifier;
   (b) applying to said amplifier an input optical pulse of short duration relative to the carrier lifetime of the amplifier, the pulse duration being less than two nanoseconds, to produce an optical output pulse of increased peak power of at least 10 mW;
   (c) subsequent to said step (b), waiting a time period in excess of twice the carrier lifetime and maintaining the application of said bias current in the absence of an input optical pulse so that the carrier density in the amplifier has substantially completely recovered from depletion by the preceding pulse;
   (d) subsequent to said step (c), maintaining the application of said bias current and repeating said step (b); and
   (e) repeating said step (d) to obtain the benefit of the increased peak power of the output pulses.

2. A portable semiconductor laser system comprising:
   source means capable of generating a regular optical pulse stream which comprises optical pulses having a duration of between 10 and 200 pico seconds and separated by intervals at least twenty times the duration of one of said pulses;
   a semiconductor laser amplifier having an input port to receive the pulse stream generated by said source means and an output port for the emission of amplified optical pulses, the peak power of said output pulses being at least 100 mW;
   wherein the source means is arranged in use such that the intervals between the pulses which are input to said amplifier exceed twice the carrier lifetime, and wherein, in use, the peak power of said amplified optical pulses is greater than that which would be obtained were the pulses input to said amplifier separated by intervals which did not exceed half the carrier lifetime.

3. An optical amplifier according to claim 2 in which the amplifier is a travelling wave amplifier.

4. An optical amplifier according to claim 3 in which the gain ripple is at most 3 dB.

5. An optical amplifier according to any preceding claim 2 in which the output pulse duration is at most one half of the carrier lifetime.

6. An optical amplifier according to any preceding claim 2 in which the output pulse duration is at most one third of the carrier lifetime.

7. An optical amplifier according to any preceding claim 2 in which the interval between output pulses is at least equal to carrier lifetime.

8. An optical amplifier according to any preceding claim 2 arranged to receive input data in return to zero format.

9. An optical amplifier according to any preceding claim 2 in which the amplified output pulses comprise a return to zero format data stream.

10. An optical amplifier according to claim 9 in which the return to zero data format comprises signal pulses of a duration less than half of the bit period.

11. An optical amplifier according to claim 10 in which the pulses are at the beginning portion of a bit period.

12. An optical amplifier according to claim 8 in which the bit period is of a duration at least equal to twice the carrier lifetime.

13. An optical pulse source comprising an optical amplifier according to any preceding claim 2 in combination with an optical pulse source and a pulse processor arranged to input pulses to the amplifier with a pulse duration substantially less than the carrier lifetime and a pulse interval at least substantially equal to with the carrier lifetime.

14. In a portable semiconductor laser source for producing high power optical pulses, said system of the type including a semiconductor travelling wave wideband optical amplifier having a certain carrier lifetime, a method for driving said amplifier comprising:
   (a) applying a bias current to said laser amplifier less than is required to induce lasing in said amplifier, said bias current establishing a particular internal carrier density within said semiconductor amplifier;
   (b) producing an optical excitation pulse having a peak power of at least 1 mW, less than 2 nanoseconds long and of short duration relative to said carrier lifetime;
   (c) exciting said semiconductor travelling wave optical amplifier over said short duration with said optical excitation pulse produced by said step (b), including the step of depleting the concentration of carriers within said semiconductor amplifier;
   (d) subsequent to said step (c), waiting a time period after said short duration expires, while maintaining a bias current on said amplifier, said time period being in excess of twice the time needed to allow said amplifier carrier concentration to recover from said exciting step; and
   (e) without interrupting said bias current on said amplifier and subsequent to said step (d), repeating at least said steps (b) and (c) while maintaining the bias current on said amplifier.

15. A method as in claim 14 wherein said method further includes repeating said step (b), and said step (d) includes the step of blocking pulses produced by said step (b) until said amplifier carrier density recovers.

16. A method as in claim 14 wherein said step (b) includes the steps of pulsing a constricted mesa laser to produce an optical pulse, and compressing said produced optical pulse.

17. A method of operating a semiconductor travelling wave laser amplifier of the type exhibiting carrier density depletion, said method including the steps of:
   (a) applying a bias current to said laser amplifier less than is required to induce lasing in said amplifier, said bias current establishing an internal carrier density within said semiconductor amplifier;
   (b) exciting said amplifier with a stream of optical pulses; and
   (c) controlling the repetition rate and duration of said optical pulses so as to maximize the peak output power of said amplifier, including the steps of:
   exciting said amplifier with an optical pulse having a peak power of at least 1 mW, less than 2 nanoseconds in duration and thereby causing depletion of said internal carrier density, and
   waiting for a time period in excess of twice the time required for said amplifier internal carrier density to substantially recover from said depletion, while maintaining the application of said bias current, before exciting said amplifier with another optical pulse having a peak power of at least 1 mW and of less than 2 nanoseconds duration.

18. A portable high power semiconductor laser source comprising:
a wideband semiconductor optical amplifier means for producing optical output pulses in response to optical excitation, said amplifier means exhibiting carrier concentration depletion in response to said excitation; and
driving means optically coupled to said optical amplifier means for generating optical excitation pulses less than 2 nanoseconds in duration and for applying a series of such excitation pulses to said amplifier means, said driving means including means for providing an interval between said excitation pulses in excess of twice the time interval sufficient to permit said amplifier means to substantially recover from said carrier concentration depletion, and for controlling the durations of said pulses to be substantially less than the time said amplifier takes to recover from said carrier concentration depletion.

19. A source as in claim 18 wherein said series of excitation pulses define bit periods and said driving means includes means connected to receive input data signals for converting said input data signals to return-to-zero format in which data pulses representing binary "1" values occupy only a small proportion of said bit periods.

20. A source as in claim 18 wherein said driving means includes means for providing said series of excitation pulses at a pulse repetition interval of the order of 10 ns, the pulses being 200 picoseconds or less in duration.

21. A source as in claim 18 wherein said amplifier means comprises a travelling wave amplifier.

22. A source as in claim 18 wherein said amplifier means comprises:
a laser having first and second facets, and
first and second single layer refractory oxide anti-reflection coatings being disposed on said first and second facets, respectively.

23. A source as in claim 18 wherein said driving means comprises means for generating said series of pulses with a pulse repetition interval $T_r$ of about 10 ns and pulse durations of about 40 ps, and said amplifier means has a peak saturation power of about 1 mW and produces a peak pulse power of on the order of at least 250 mW.

24. A source as in claim 18 wherein said driving means comprises means for generating said series of pulses with intervals between pulses being on the order of at least two times the time of said recovery and with pulse durations of at most one tenth of said pulse intervals.

25. A method of operating a semiconductor laser amplifier of the type having a semiconductor medium exhibiting carrier density depletion, said method including the steps of:
(a) applying a bias current to said laser amplifier less than is required to induce lasing in said amplifier, said bias current establishing an internal carrier density level within the said semiconductor amplifier;
(b) exciting said amplifier with an optical pulse having a peak power of at least 10 mw and less than 2 nanoseconds in duration, including the steps of depleting said established internal carrier density level during said exciting while causing said amplifier to generate an output optical signal having a peak power of at least 100 mw;
(c) changing the refractive index of said medium during said depleting step, thereby shifting the wavelength of said output optical signal; and
(d) controlling the repetition rate and duration of said optical pulses so as to maximize the peak output power of said amplifier, including the step of waiting a time interval in excess of twice the time required for said amplifier internal carrier density to substantially recover from said depletion before repeating said step (b) and to substantially return to said established level.

26. A method as claimed in claim 1 wherein the only optical output pulses which are utilized are those which result from the passage through the amplifier of optical input pulses received when the carrier density is at a level equal to that which obtains when there has been complete carrier density recovery from depletion caused by an earlier preceding pulse.

27. A method of operating a semiconductor laser amplifier of the type having a semiconductor medium exhibiting carrier density depletion, said amplifier also having an anti-reflection coating on at least one laser facet, said method including the steps of:
(a) applying a bias current to said laser amplifier less than the bias current required to induce lasing in said amplifier, said bias current establishing an internal carrier density within the said amplifier;
(b) exciting said amplifier with optical pulses, said excitation depleting said established internal carrier density and causing said amplifier to generate output optical signals having a peak power of at least 100 mw; and
(c) providing said excitation optical pulses with a time interval between pulses in excess of twice the time required for said amplifier internal carrier density to substantially recover from said depletion.

28. A method as in claim 26 wherein said providing step (c) includes providing said pulses with a duration of substantially less than said recovery time.

29. A method as in claim 26 further including the step of increasing said time interval between pulses beyond twice the time required for said amplifier carrier density to substantially recover from depletion so as to linearly further increase said peak power.

30. A method as in claim 26 further including the step of generating said excitation optical pulses in response to a data encoding scheme which avoids runs of successive data pulses.

* * * * *